United States Patent
Guterman et al.

(10) Patent No.: US 9,350,068 B2
(45) Date of Patent: May 24, 2016

(54) ELECTRONIC DEVICE WITH DUAL CLUTCH BARREL CAVITY ANTENNAS

(71) Applicant: Apple Inc., Cupertino, CA (US)

(72) Inventors: Jerzy Guterman, Mountain View, CA (US); Qingxiang Li, Mountain View, CA (US); Mattia Pascolini, San Francsico, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/733,746

(22) Filed: Jun. 8, 2015

(65) Prior Publication Data

US 2015/0270598 A1    Sep. 24, 2015

Related U.S. Application Data

(63) Continuation of application No. 14/202,860, filed on Mar. 10, 2014.

(51) Int. Cl.
*H01Q 1/24* (2006.01)
*H01Q 1/22* (2006.01)
*H01Q 9/42* (2006.01)

(52) U.S. Cl.
CPC .............. *H01Q 1/2266* (2013.01); *H01Q 9/42* (2013.01)

(58) Field of Classification Search
CPC ....................................................... H01Q 1/24
USPC ................... 343/702, 767, 770, 846, 700 MS
See application file for complete search history.

(56) References Cited

U.S. PATENT DOCUMENTS

| | | |
|---|---|---|
| 4,509,056 A | 4/1985 | Ploussios |
| 5,258,892 A | 11/1993 | Stanton et al. |

(Continued)

FOREIGN PATENT DOCUMENTS

| | | |
|---|---|---|
| EP | 1083622 | 3/2001 |
| EP | 1 739 785 | 1/2007 |

(Continued)

OTHER PUBLICATIONS

"AirPort Product-Specific Details", AirPort Developer Note, [Online], Updated: Apr. 28, 2008, Retrieved: Sep. 25, 2008, <http://developer.apple.com/documentation/HardwareDrivers/Conceptual/Hwrech_AirportjArticles/ ElAirP_implementation.html>.

(Continued)

*Primary Examiner* — Huedung Mancuso
(74) *Attorney, Agent, or Firm* — Treyz Law Group, P.C.; G. Victor Treyz; Michael H. Lyons

(57) ABSTRACT

An electronic device has antennas formed from cavity antenna structures. The electronic device may have a metal housing. The metal housing may have an upper housing in which a component such as a display is mounted and a lower housing in which a component such as a keyboard is mounted. Hinges may be used to mount the upper housing to the lower housing for rotation about a rotational axis. Cavity antennas may be formed in a clutch barrel region located between the hinges and running along the rotational axis. A flexible printed circuit may be formed between the cavity antennas. Each cavity antenna may have a first end that is adjacent to one of the hinges and a second end that is adjacent to the flexible printed circuit. Cavity walls for the cavity antennas may be formed from metal housing structures such as metal portions of the lower housing.

20 Claims, 11 Drawing Sheets

(56) References Cited

U.S. PATENT DOCUMENTS

| | | | |
|---|---|---|---|
| 5,463,406 A | 10/1995 | Vannatta et al. |
| 5,608,413 A | 3/1997 | Macdonald |
| 5,784,032 A | 7/1998 | Johnston et al. |
| 5,917,458 A | 6/1999 | Ho et al. |
| 6,184,845 B1 | 2/2001 | Leisten et al. |
| 6,272,356 B1 | 8/2001 | Dolman et al. |
| 6,301,489 B1 | 10/2001 | Winstead et al. |
| 6,307,512 B1 | 10/2001 | Geeraert |
| 6,380,899 B1 | 4/2002 | Madsen et al. |
| 6,392,605 B2 | 5/2002 | Anterow |
| 6,392,610 B1 | 5/2002 | Braun et al. |
| 6,414,643 B2 * | 7/2002 | Cheng et al. | 343/702 |
| 6,421,029 B1 | 7/2002 | Tanabe |
| 6,448,942 B2 | 9/2002 | Weinberger et al. |
| 6,456,249 B1 | 9/2002 | Johnson |
| 6,486,836 B1 | 11/2002 | Hill |
| 6,539,608 B2 | 4/2003 | McKinnon et al. |
| 6,552,692 B1 | 4/2003 | Zeilinger et al. |
| 6,570,538 B2 | 5/2003 | Vaisanen et al. |
| 6,614,400 B2 | 9/2003 | Egorov |
| 6,636,181 B2 | 10/2003 | Asano et al. |
| 6,639,558 B2 | 10/2003 | Kellerman et al. |
| 6,667,719 B2 | 12/2003 | LaKomski |
| 6,781,546 B2 | 8/2004 | Wang et al. |
| 6,791,506 B2 | 9/2004 | Suganthan et al. |
| 6,819,287 B2 | 11/2004 | Sullivan et al. |
| 6,847,329 B2 | 1/2005 | Ikegaya et al. |
| 6,861,989 B2 | 3/2005 | Morningstar et al. |
| 6,885,880 B1 * | 4/2005 | Ali | 455/575.7 |
| 6,987,485 B2 | 1/2006 | Ito et al. |
| 6,995,718 B2 * | 2/2006 | Fang | 343/702 |
| 7,053,850 B1 | 5/2006 | Bogdans et al. |
| 7,068,229 B2 | 6/2006 | Lin |
| 7,181,172 B2 | 2/2007 | Sullivan et al. |
| 7,183,983 B2 | 2/2007 | Ozden |
| 7,339,530 B2 | 3/2008 | Ying et al. |
| 7,345,646 B1 | 3/2008 | Lin et al. |
| 7,447,530 B2 | 11/2008 | Iwai et al. |
| 7,551,142 B1 | 6/2009 | Zhang et al. |
| 7,595,759 B2 | 9/2009 | Schlub et al. |
| 7,639,190 B2 | 12/2009 | Shimasaki et al. |
| 7,705,789 B2 | 4/2010 | Suzuki et al. |
| 7,750,854 B2 | 7/2010 | Wedel et al. |
| 7,768,461 B2 | 8/2010 | Cheng et al. |
| 7,768,462 B2 | 8/2010 | Zhang et al. |
| 7,804,458 B2 * | 9/2010 | Montgomery et al. | 343/767 |
| 7,916,089 B2 | 3/2011 | Schlub et al. |
| 8,059,039 B2 | 11/2011 | Ayala Vazquez et al. |
| 8,059,040 B2 * | 11/2011 | Ayala Vazquez et al. | 343/702 |
| 8,264,412 B2 | 9/2012 | Ayala et al. |
| 8,269,675 B2 | 9/2012 | Kough et al. |
| 8,319,692 B2 | 11/2012 | Chiang et al. |
| 8,325,094 B2 | 12/2012 | Ayala Vazquez et al. |
| 8,325,096 B2 | 12/2012 | Ayala Vazquez et al. |
| 8,482,469 B2 * | 7/2013 | Ayala et al. | 343/702 |
| 8,508,418 B2 * | 8/2013 | Kough et al. | 343/702 |
| 8,638,549 B2 | 1/2014 | Garelli et al. |
| 2001/0040529 A1 | 11/2001 | Cheng |
| 2002/0024469 A1 | 2/2002 | Masaki |
| 2002/0080565 A1 | 6/2002 | Teshima |
| 2002/0163473 A1 | 11/2002 | Koyama |
| 2003/0222823 A1 | 12/2003 | Flint et al. |
| 2004/0051670 A1 | 3/2004 | Sato |
| 2004/0219956 A1 | 11/2004 | Iwai et al. |
| 2004/0257283 A1 | 12/2004 | Asano et al. |
| 2005/0041624 A1 | 2/2005 | Hui et al. |
| 2005/0062657 A1 | 3/2005 | Lin |
| 2006/0038736 A1 | 2/2006 | Hui et al. |
| 2006/0145931 A1 | 7/2006 | Ranta |
| 2006/0158379 A1 | 7/2006 | Ishimiya |
| 2006/0238437 A1 | 10/2006 | Huang |
| 2006/0244663 A1 | 11/2006 | Fleck et al. |
| 2007/0069958 A1 | 3/2007 | Ozkar |
| 2007/0126651 A1 | 6/2007 | Snyder et al. |
| 2007/0140072 A1 | 6/2007 | Agrawal et al. |
| 2008/0018542 A1 | 1/2008 | Yamazaki et al. |
| 2008/0106478 A1 | 5/2008 | Hill |
| 2008/0143611 A1 | 6/2008 | Wang |
| 2008/0166004 A1 | 7/2008 | Stanford et al. |
| 2008/0231522 A1 * | 9/2008 | Montgomery et al. | 343/702 |
| 2008/0258992 A1 | 10/2008 | Tsai |
| 2009/0051604 A1 | 2/2009 | Zhang et al. |
| 2009/0153411 A1 | 6/2009 | Chiang et al. |
| 2009/0174611 A1 | 7/2009 | Schlub et al. |
| 2009/0174612 A1 | 7/2009 | Ayala et al. |
| 2009/0243943 A1 | 10/2009 | Mumbru et al. |
| 2009/0273529 A1 | 11/2009 | Liu |
| 2010/0073241 A1 | 3/2010 | Ayala Vazquez et al. |
| 2010/0073242 A1 | 3/2010 | Ayala Vazquez et al. |
| 2010/0073243 A1 | 3/2010 | Ayala Vazquez et al. |
| 2010/0134361 A1 | 6/2010 | Nakano |
| 2010/0156741 A1 | 6/2010 | Vazquez et al. |
| 2010/0182205 A1 | 7/2010 | Chiang |
| 2012/0026048 A1 | 2/2012 | Vazquez et al. |
| 2012/0068893 A1 | 3/2012 | Guterman et al. |
| 2012/0074988 A1 | 3/2012 | Lashkari et al. |
| 2012/0169550 A1 | 7/2012 | Schlub et al. |
| 2013/0003284 A1 | 1/2013 | Massaro et al. |
| 2013/0009833 A1 | 1/2013 | Kough et al. |
| 2013/0050032 A1 | 2/2013 | Shiu et al. |
| 2013/0127669 A1 | 5/2013 | Han et al. |
| 2013/0293425 A1 | 11/2013 | Zhu et al. |
| 2013/0321216 A1 | 12/2013 | Jervis et al. |
| 2014/0361932 A1 | 12/2014 | Irci et al. |

FOREIGN PATENT DOCUMENTS

| | | |
|---|---|---|
| JP | 2000004120 | 7/2000 |
| JP | 2004363848 | 12/2004 |
| JP | 2006527941 | 12/2006 |
| TW | 200843205 | 11/2008 |
| WO | 2004112187 | 12/2004 |
| WO | 2005 120164 | 12/2005 |
| WO | 2006018711 | 2/2006 |
| WO | 2009142000 | 11/2009 |

OTHER PUBLICATIONS

R. Brancroft, "A Commercial Perspective on the Development and Integration of an 802.11albig HiperLanNVLAN Antenna into Laptop Computers" Centurion Wireless Technologies, IEEE: ArtOntlas end Propagvtion itlarreeino. vol. 48. No. 4, Aug. 2006.

Wikipedia contributors, "MacBook Pro," Wikipedia, The Free Encyclopedia, [online] <http://en.wikipedia.org/w/index.php?title=MacBook_Pro&oldid=506131750>, retrieved Aug. 7.

Guterman et al., U.S. Appl. No. 14/640,787, filed Mar. 6, 2015.

* cited by examiner

ELECTRONIC DEVICE WITH DUAL CLUTCH BARREL CAVITY ANTENNAS

This application is a continuation of patent application Ser. No. 14/202,860, filed Mar. 10, 2014, which is hereby incorporated by reference herein in its entirety.

BACKGROUND

This relates generally to electronic devices and, more particularly, to electronic devices with antennas.

Electronic devices often include antennas. For example, cellular telephones, computers, and other devices often contain antennas for supporting wireless communications.

It can be challenging to form electronic device antenna structures with desired attributes. In some wireless devices, the presence of conductive housing structures can influence antenna performance. Antenna performance may not be satisfactory if the housing structures are not configured properly and interfere with antenna operation. Device size can also affect performance. It can be difficult to achieve desired performance levels in a compact device, particularly when the compact device has conductive housing structures.

It would therefore be desirable to be able to provide improved wireless circuitry for electronic devices such as electronic devices that include conductive housing structures.

SUMMARY

An electronic device such as a portable computer may be provided with antennas. The antennas may be cavity antennas. Each cavity antenna may have a metal cavity structure that defines an antenna cavity and may have an antenna resonating element that is mounted within the cavity.

The electronic device may have a metal housing. The metal housing may have an upper housing in which a component such as a display is mounted and a lower housing in which a component such as a keyboard is mounted. Hinges may be used to mount the upper housing to the lower housing. Cavity antennas may be formed in a clutch barrel region located between the hinges. Cavity structures may be formed from metal portions of the housing such as portions of the lower housing.

A flexible printed circuit may be formed between first and second cavity antennas. Each cavity antenna may have an outer end that is adjacent to one of the hinges and an inner end that is adjacent to the flexible printed circuit.

Components such as speakers may be mounted within antenna cavities. The speakers may be isolated from the antennas using inductors.

DETAILED DESCRIPTION

Figure 1:
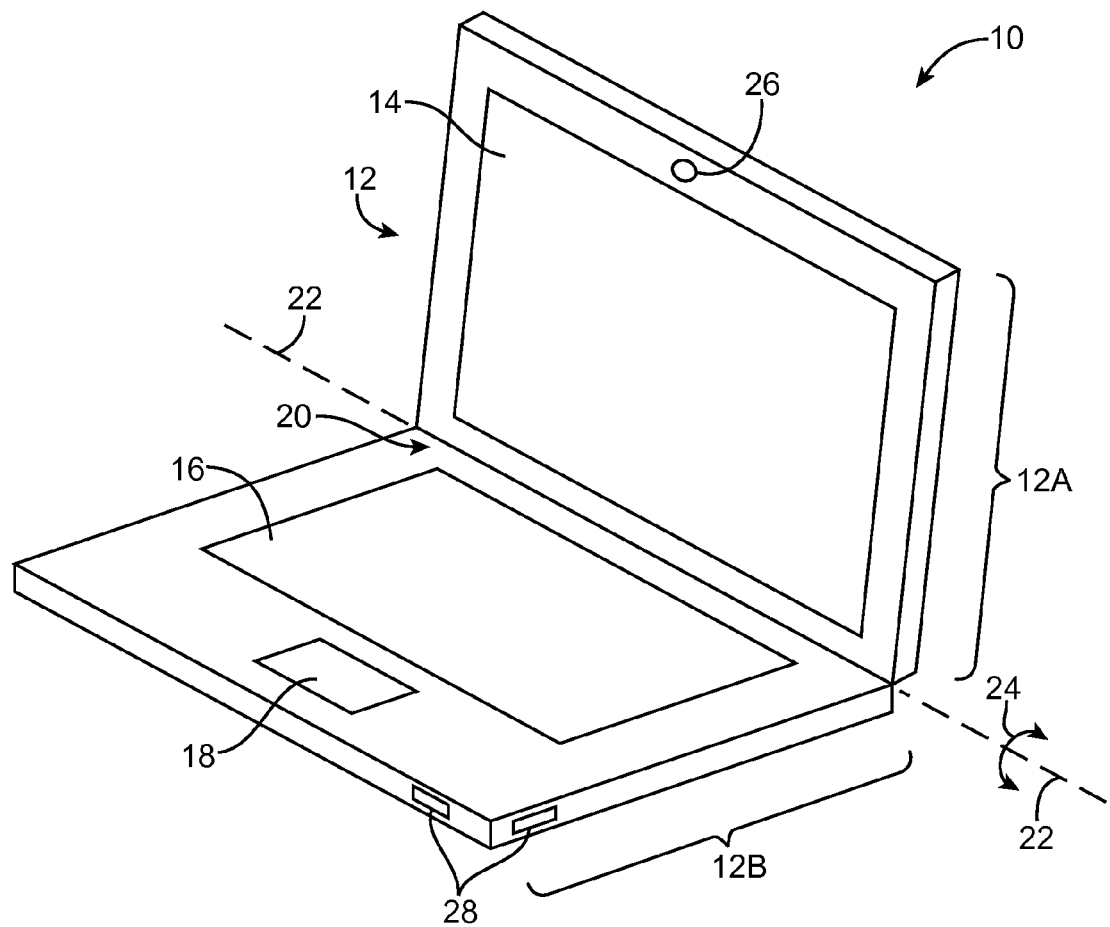
FIG. 1 is a perspective view of an illustrative electronic device such as a laptop computer in accordance with an embodiment.

An electronic device such as electronic device 10 of FIG. 1 may contain wireless circuitry. For example, electronic device 10 may contain wireless communications circuitry that operates in long-range communications bands such as cellular telephone bands and wireless circuitry that operates in short-range communications bands such as the 2.4 GHz Bluetooth® band and the 2.4 GHz and 5 GHz WiFi® wireless local area network bands (sometimes referred to as IEEE 802.11 bands or wireless local area network communications bands). Device 10 may also contain wireless communications circuitry for implementing near-field communications, communications at 60 GHz, light-based wireless communications, satellite navigation system communications, or other wireless communications.

Device 10 may be a handheld electronic device such as a cellular telephone, media player, gaming device, or other device, may be a laptop computer, tablet computer, or other portable computer, may be a desktop computer, may be a computer display, may be a display containing an embedded computer, may be a television or set top box, or may be other electronic equipment. Configurations in which device 10 has a rotatable lid as in a portable computer are sometimes described herein as an example. This is, however, merely illustrative. Device 10 may be any suitable electronic equipment.

As shown in the example of FIG. 1, device 10 may have a housing such as housing 12. Housing 12 may be formed from plastic, metal (e.g., aluminum), fiber composites such as carbon fiber, glass, ceramic, other materials, and combinations of these materials. Housing 12 or parts of housing 12 may be formed using a unibody construction in which housing structures are formed from an integrated piece of material. Multipart housing constructions may also be used in which housing 12 or parts of housing 12 are formed from frame structures, housing walls, and other components that are attached to each other using fasteners, adhesive, and other attachment mechanisms.

Some of the structures in housing 12 may be conductive. For example, metal parts of housing 12 such as metal housing walls may be conductive. Other parts of housing 12 may be formed from dielectric material such as plastic, glass, ceramic, non-conducting composites, etc. To ensure that antenna structures in device 10 function properly, care should be taken when placing the antenna structures relative to the conductive portions of housing 12. If desired, portions of housing 12 may form part of the antenna structures for device 10. For example, conductive housing sidewalls may form an antenna ground element. The antenna ground element may be configured to form one or more cavities for cavity-backed antennas. The cavities in the cavity-backed antennas may be formed from portions of housing 12 located between hinges in a portable computer and/or other conductive electronic device structures.

As shown in FIG. 1, device 10 may have input-output devices such as track pad 18 and keyboard 16. Camera 26 may be used to gather image data. Device 10 may also have components such as microphones, speakers, buttons, removable storage drives, status indicator lights, buzzers, sensors, and other input-output devices. These devices may be used to gather input for device 10 and may be used to supply a user of device 10 with output. Ports in device 10 such as ports 28 may receive mating connectors (e.g., an audio plug, a connector associated with a data cable such as a Universal Serial Bus cable, a data cable that handles video and audio data such as a cable that connects device 10 to a computer display, television, or other monitor, etc.).

Device 10 may include a display such a display 14. Display 14 may be a liquid crystal display (LCD), a plasma display, an organic light-emitting diode (OLED) display, an electronic ink display, or a display implemented using other display technologies. A touch sensor may be incorporated into display 14 (i.e., display 14 may be a touch screen display). Touch sensors for display 14 may be resistive touch sensors, capacitive touch sensors, acoustic touch sensors, light-based touch sensors, force sensors, or touch sensors implemented using other touch technologies.

Device 10 may have a one-piece housing or a multi-piece housing. As shown in FIG. 1, for example, electronic device 10 may be a device such as a portable computer or other device that has a two-part housing formed from upper housing 12A and lower housing 12B. Upper housing 12A may include display 14 and may sometimes be referred to as a display housing or lid. Lower housing 12B may sometimes be referred to as a base or main housing. Housings 12A and 12B may be connected to each other using a hinge (e.g., a hinge located in region 20 along the upper edge of lower housing 12B and the lower edge of upper housing 12A). The hinge may allow upper housing 12A to rotate about axis 22 in directions 24 relative to lower housing 12B. The plane of lid (upper housing) 12A and the plane of lower housing 12B may be separated by an angle that varies between 0° when the lid is closed to 90°, 140°, or more when the lid is fully opened.

Figure 2:
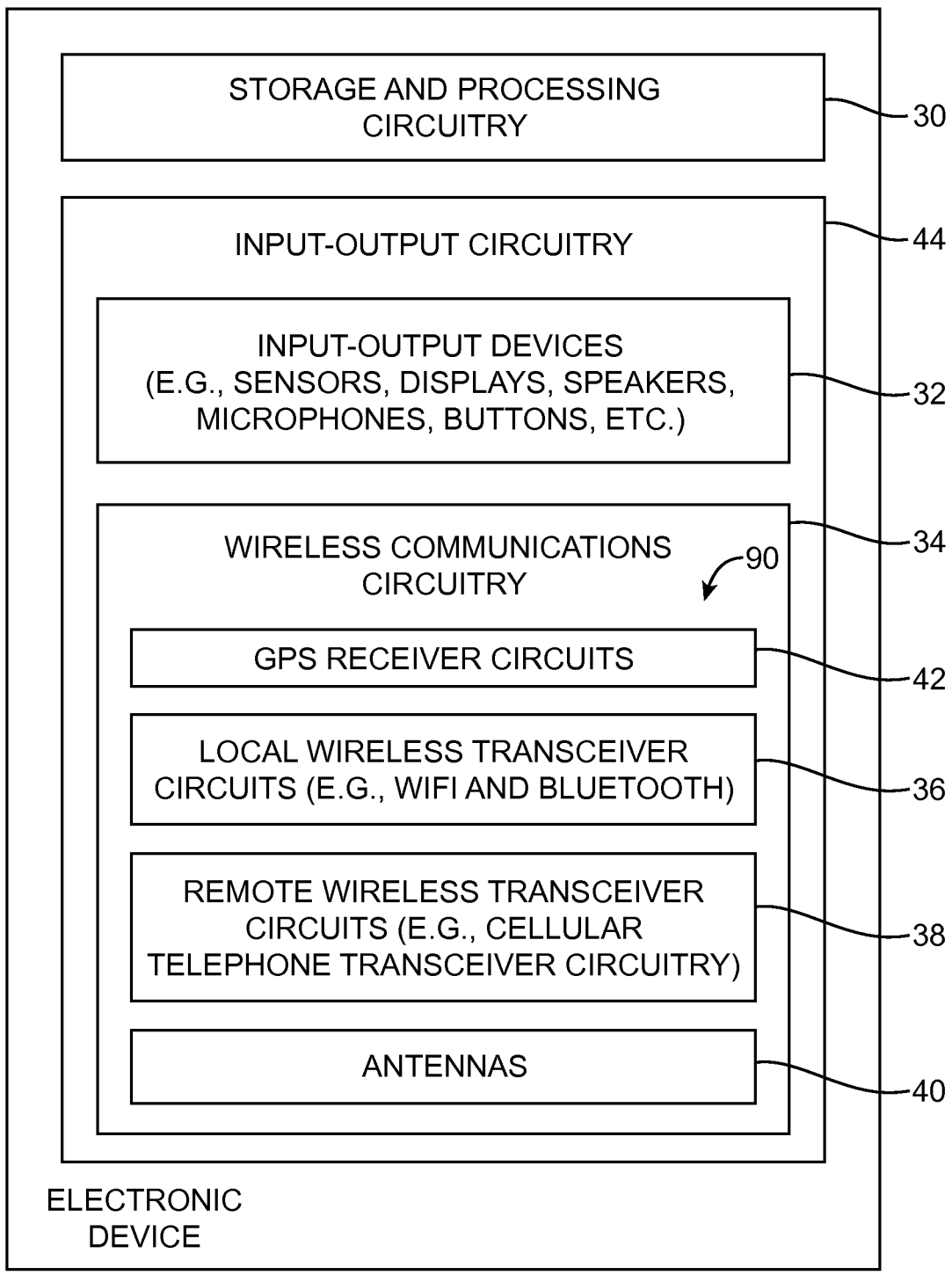
FIG. 2 is a schematic diagram of an illustrative electronic device with wireless circuitry in accordance with an embodiment.

A schematic diagram showing illustrative components that may be used in device 10 is shown in FIG. 2. As shown in FIG. 2, device 10 may include control circuitry such as storage and processing circuitry 30. Storage and processing circuitry 30 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 30 may be used to control the operation of device 10. This processing circuitry may be based on one or more microprocessors, microcontrollers, digital signal processors, application specific integrated circuits, etc.

Storage and processing circuitry 30 may be used to run software on device 10, such as internet browsing applications, voice-over-internet-protocol (VOIP) telephone call applications, email applications, media playback applications, operating system functions, etc. To support interactions with external equipment, storage and processing circuitry 30 may be used in implementing communications protocols. Communications protocols that may be implemented using storage and processing circuitry 30 include internet protocols, wireless local area network protocols (e.g., IEEE 802.11 protocols—sometimes referred to as WiFi®), protocols for other short-range wireless communications links such as the Bluetooth® protocol, cellular telephone protocols, MIMO protocols, antenna diversity protocols, etc.

Input-output circuitry 44 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, etc.

Input-output circuitry 44 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, and 42. Transceiver circuitry 36 may be wireless local area network transceiver circuitry that may handle 2.4 GHz and 5 GHz bands for WiFi® (IEEE 802.11) communications and that may handle the 2.4 GHz Bluetooth® communications band. Circuitry 34 may use cellular telephone transceiver circuitry 38 for handling wireless communications in frequency ranges such as a low communications band from 700 to 960 MHz, a midband from 1710 to 2170 MHz, and a high band from 2300 to 2700 MHz or other communications bands between 700 MHz and 2700 MHz or other suitable frequencies (as examples). Circuitry 38 may handle voice data and non-voice data. Wireless communications circuitry 34 can include circuitry for other short-range and long-range wireless links if desired. For example, wireless communications circuitry 34 may include 60 GHz transceiver circuitry, circuitry for receiving television and radio signals, paging system transceivers, near field communications (NFC) circuitry, etc. Wireless communications circuitry 34 may include satellite navigation system circuitry such as global positioning system (GPS) receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, hybrids of these designs, etc. If desired, one or more of antennas 40 may be cavity-backed antennas. Different types of antennas may be used for different bands and combinations of bands. For example, one type of antenna may be used in forming a local wireless link antenna and another type of antenna may be used in forming a remote wireless link antenna.

Transmission line paths may be used to couple antenna structures 40 to transceiver circuitry 90. Transmission lines in device 10 may include coaxial cable paths, microstrip transmission lines, stripline transmission lines, edge-coupled microstrip transmission lines, edge-coupled stripline transmission lines, transmission lines formed from combinations of transmission lines of these types, etc. Filter circuitry, switching circuitry, impedance matching circuitry, and other circuitry may be interposed within the transmission lines, if desired.

Figure 3:
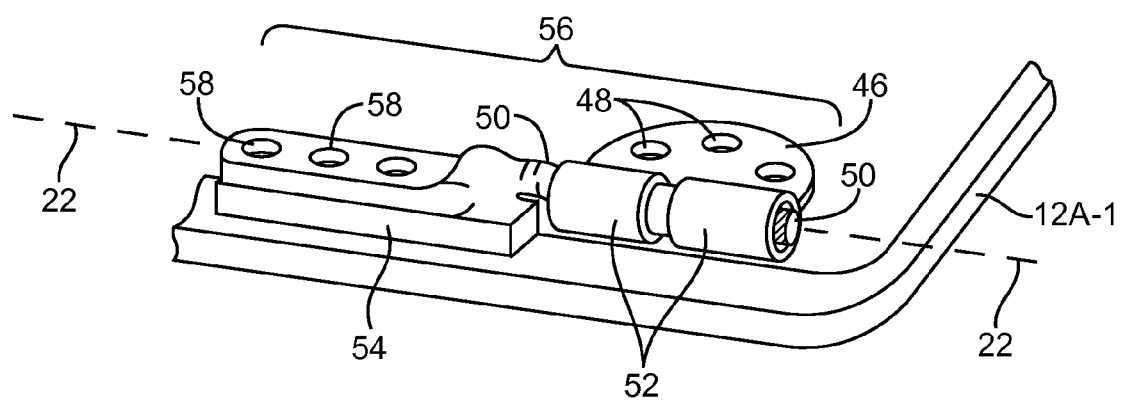
FIG. 3 is a perspective view of an illustrative hinge of the type that may be used in an electronic device with housing portions that rotate relative to each other in accordance with an embodiment.

Hinges may be used to allow portions of an electronic device to rotate relative to each other. Hinges may, for example, be used to allow upper housing 12A of FIG. 1 to rotate relative to lower housing 12B about rotational axis 22. The hinge structures that are used to attach housings 12A and 12B together are sometimes referred to as clutch structures or clutches. An illustrative clutch (hinge) is shown in FIG. 3. As shown in FIG. 3, clutch (hinge) 56 may have a structure such as structure 54 and a structure such as structure 46 that rotate relative to each other about axis 22. Structure 54 may have holes such as holes 58 that receive screws. The screws may be used to attach structure 54 to frame structure 12A-1 or other structures in upper housing 12A. Structure 46 may be attached to housing 12B using screws that pass through holes 48. If desired, other attachment techniques may be used to mount structure 54 to housing 12A and to mount structure 46 to housing 12B. The use of screws is merely illustrative.

Structure 54, which may sometimes referred to as a clutch pillar, may include shaft 50. Structure 46, which may sometimes be referred to as a clutch band, may have portions 52 that grip shaft 50 with a predetermined amount of friction. During operation, the clutch band holds the clutch pillar with an amount of force that allows upper housing 12A to rotate relative to lower housing 12B. Sufficient friction is present to allow a user to place upper housing 12A at a desired angle relative to lower housing 12B without slipping. Structure 12A-1 may be attached to other structures in housing 12A such as display 14, housing wall structures (e.g., metal housing structures), etc. The portions of housing 12B that are attached to structure 46 may include housing structures such as a metal frame, metal sidewalls, and other housing structures.

Figure 4:
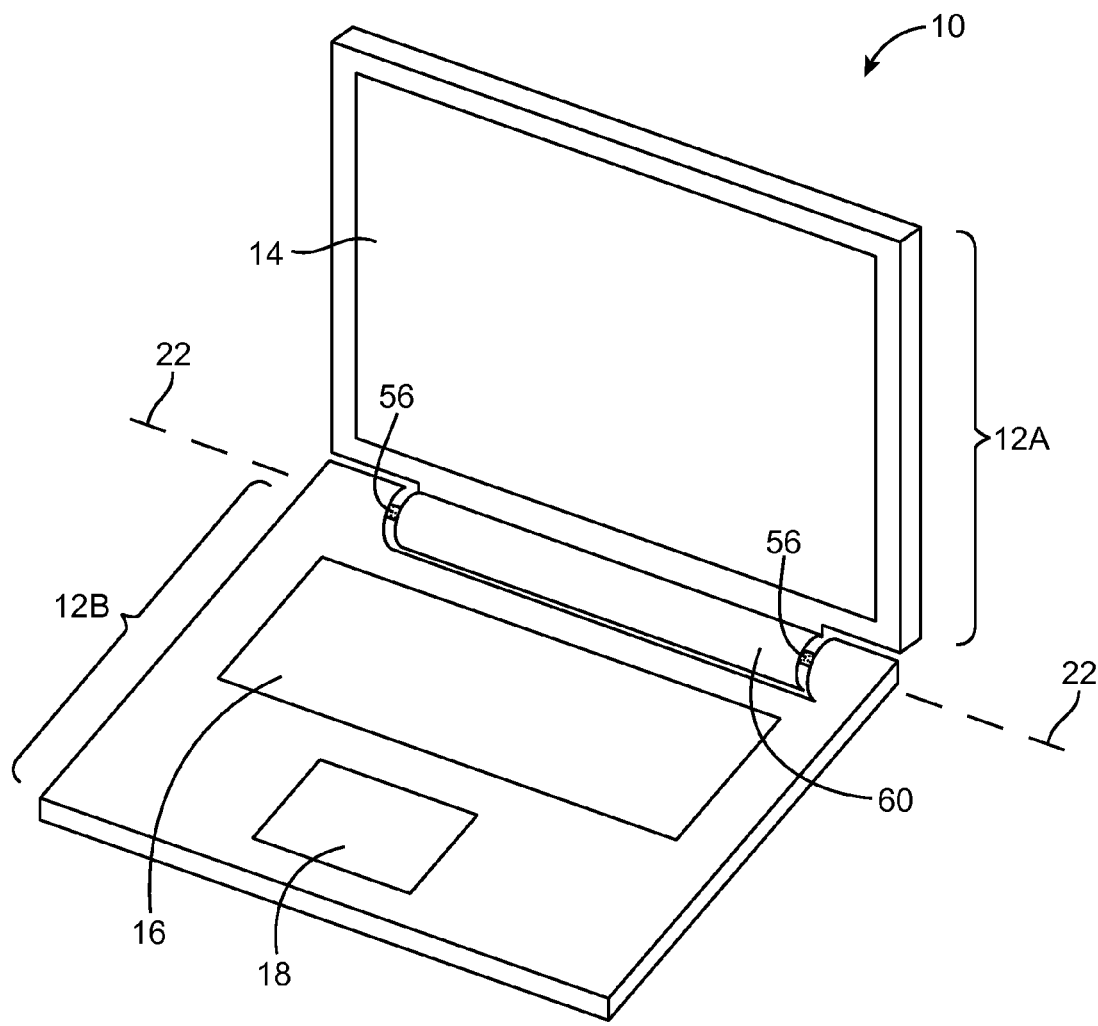
FIG. 4 is a perspective view of an illustrative electronic device such as a portable computer showing how the electronic device may have a clutch barrel region in which antennas can be formed in accordance with an embodiment.

A pair of hinge structures such as hinge 56 of FIG. 3 may be mounted within portions of housing 12 to form a hinge for device 10. As shown in FIG. 4, for example, hinge structures 56 may be mounted at either end of a region in housing 12 such as clutch barrel region 60 (i.e., a hinge for device 10 may be formed by placing a structure such as hinge 56 of FIG. 3 at each of the two opposing ends of clutch barrel 60). Clutch barrel 60 may have a cylindrical shape as shown in FIG. 4 or may have other shapes. Clutch barrel 60 may have a dielectric cover portion and/or may be formed form metal. For example, in configurations in which housing 12 is formed from metal, clutch barrel 60 may be part of housing 12A, may be part of housing 12B, may contain metal parts that are integral to both housing 12A and 12B, and/or may be formed from metal structures that are separate from housing 12A and 12B.

The portions of housing 12 surrounding clutch barrel 60 may be configured to form one or more cavities for cavity backed antennas. For example, a pair of cavity antennas may be formed in region 60. The cavities may have elongated shapes that run parallel to axis 22. One of hinges 56 may be located at the outer end of each cavity antenna. A conductive structure such as a printed circuit may be located between the cavities in the middle of clutch barrel 60.

Antenna structures may also be mounted at other locations within device 10 such as along the upper edge of display 12 (e.g., under the upper bezel of housing 12A), in lower housing 12B, under dielectric window structures in housing 12A or housing 12B, behind layers of glass or other dielectrics, or elsewhere in housing 12. An advantage of mounting antenna structures within the clutch barrel is that this location may permit antenna operation both when lid 12A is open and when lid 12A is closed.

Antenna structures in clutch barrel 60 may include dielectric materials (e.g., a dielectric carrier such as a plastic carrier for supporting patterned conductive antenna structures, a plastic cover or a cover formed from other dielectrics, etc.). Air (which is a dielectric) may also be present within clutch barrel 60 (e.g., in an antenna cavity). Surrounding portions of device 10 may be substantially conductive. For example, structures in upper housing 12A such as frame 12A-1 of FIG. 3, display 14 of FIG. 1, and housing sidewalls for housing 12 in which display 14 and frame 12A-1 are mounted may all be conductive (e.g., metal). Likewise, structures in housing 12B such as metal housing sidewalls, metal frame structures, ground planes on printed circuit boards, radio-frequency shielding structures, and other device components in housing 12B may be conductive.

The metal structures of housing 12 (e.g., the portions of housing 12 around clutch barrel 60) may define antenna cavities and/or slot-shaped features that affect antenna performance. For example, a cavity may be formed that affects how efficiently an antenna may operate at various different wavelengths. To enhance antenna performance, cavities (and associated gaps or slots through which the antennas may operate) may be configured to support antenna resonances at desired frequencies.

Figure 5:
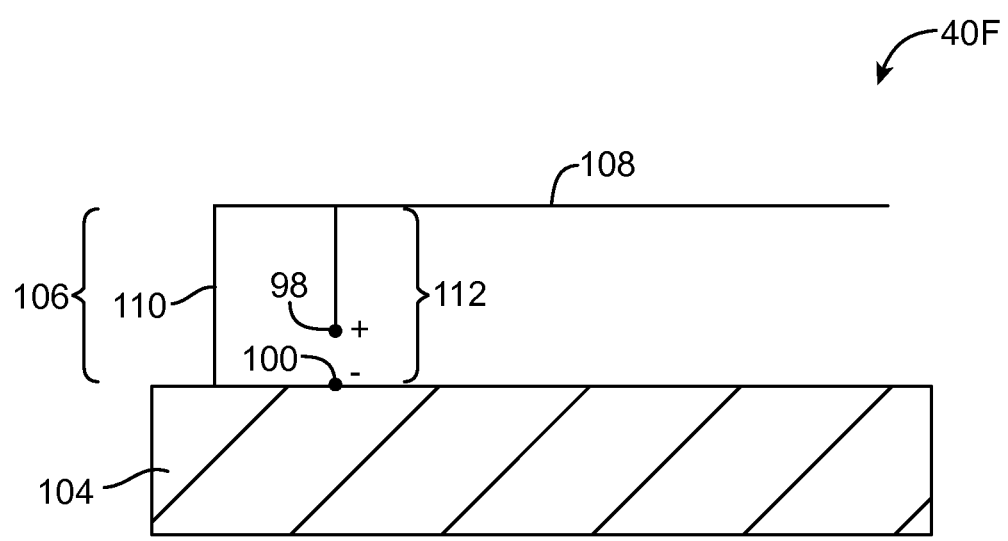
FIG. 5 is a diagram of an illustrative inverted-F antenna in accordance with an embodiment.

Cavity-backed antennas (sometimes referred to as cavity antennas) are formed from antenna resonating elements located within an antenna ground plane having the shape of a cavity (e.g., a cavity formed from metal housing 12). The antenna resonating element for a cavity antenna may be formed from a patch antenna resonating element, a monopole antenna resonating element, an inverted-F antenna resonating element, a slot antenna resonating element, or other suitable antenna resonating element structures. An illustrative inverted-F antenna of the type that may be used to feed a cavity antenna is shown in FIG. 5. Inverted-F antenna 40F of FIG. 5 or other suitable antenna structures may be used as an antenna feed for a cavity antenna by placing antenna 40F within a metal cavity.

As shown in FIG. 5, inverted-F antenna element 40F has antenna resonating element 106 and antenna ground (ground plane) 104. Ground plane 104 may be formed from metal housing 12 (e.g., portions of housing 12 shaped to form an antenna cavity). Antenna resonating element 106 may have a main resonating element arm such as arm 108. The length of arm 108 may be selected so that antenna element 40F resonates at desired operating frequencies. For example, if the length of arm 108 may be a quarter of a wavelength at a desired operating frequency for antenna element 40F. Antenna element 40F may also exhibit resonances at harmonic frequencies.

Main resonating element arm 108 may be coupled to ground 104 by return path 110. Antenna feed 112 may include positive antenna feed terminal 98 and ground antenna feed terminal 100 and may run in parallel to return path 110 between arm 108 and ground 104. If desired, inverted-F antennas such as illustrative antenna 40F of FIG. 5 may have more than one resonating arm branch (e.g., to create multiple frequency resonances to support operations in multiple communications bands) or may have other antenna structures (e.g., parasitic antenna resonating elements, tunable components to support antenna tuning, etc.). A planar inverted-F antenna (PIFA) may be formed by implementing arm 108 using planar structures (e.g., a planar metal structure such as a metal patch or strip of metal that extends into the page of FIG. 5).

Figure 6:
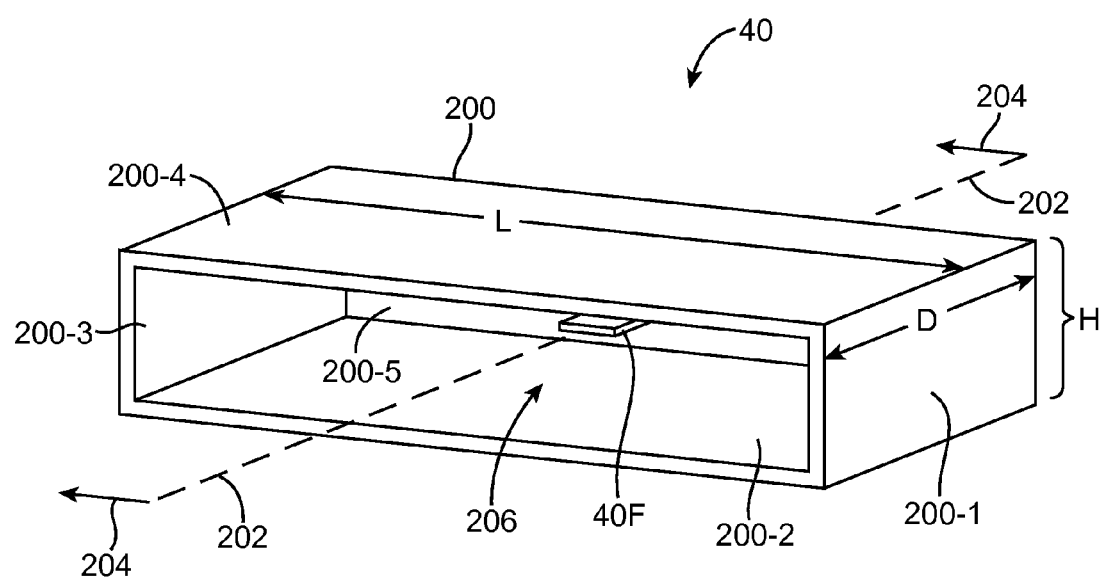
FIG. 6 is a perspective view of an illustrative cavity antenna in accordance with an embodiment.

FIG. 6 is a perspective view of an illustrative cavity antenna of the type that may be used in clutch barrel 60 of device 10. Cavity antenna 40 of FIG. 6 has cavity structures 200. Cavity structures 200 are formed from a conductive material such as metal (e.g. portions of metal housing 12 in clutch barrel region 60). Cavity structures 200 in the example of FIG. 6 form an open-front box having rear wall 200-5, upper wall 200-4, lower wall 200-2, right wall 200-1, and left wall 200-2. In device 10, different cavity shapes may be used (e.g., shapes with curved cavity walls, etc.). Cavity 206 is a recess formed within the interior of cavity structures 200. Cavity 206 may be characterized by a longer dimension such as length L, a shorter dimension such as height H, and a depth D. The configuration FIG. 6 is merely illustrative.

Figure 7:
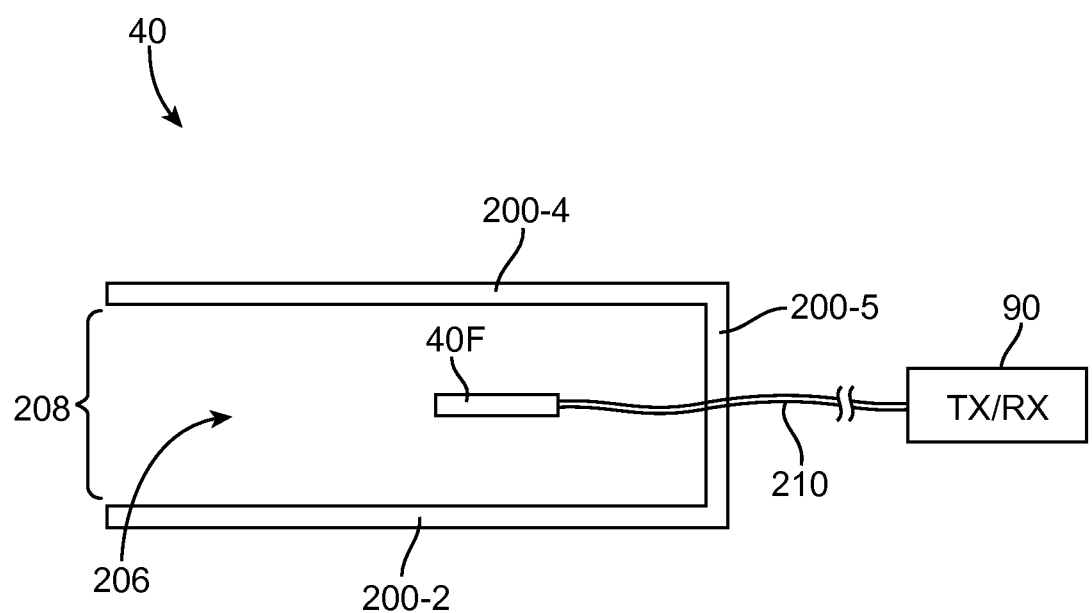
FIG. 7 is a cross-sectional side view of an illustrative cavity antenna such as the cavity antenna of FIG. 6 in accordance with an embodiment.

Antenna feed structure 40F for cavity antenna 40 may be formed within cavity 206. A cross-sectional side view of the structures of FIG. 6 taken along line 202 and viewed in direction 204 is shown in FIG. 7. As shown in FIG. 7, antenna element 40F (e.g., an inverted-F antenna resonating element or other suitable antenna resonating element) may be located within cavity 206 in the interior of cavity structures 200. Antenna element 40F serves as a feed for cavity antenna 40. Transmission line 210 may couple antenna element 40F to radio-frequency transceiver circuitry 90.

Cavity structures 200 may be provided with an opening such as opening 208. During operation, incoming antenna signals may be received by element 40F through opening 208 and transmitted antenna signals from element 40F may be emitted through opening 208.

Figure 8:
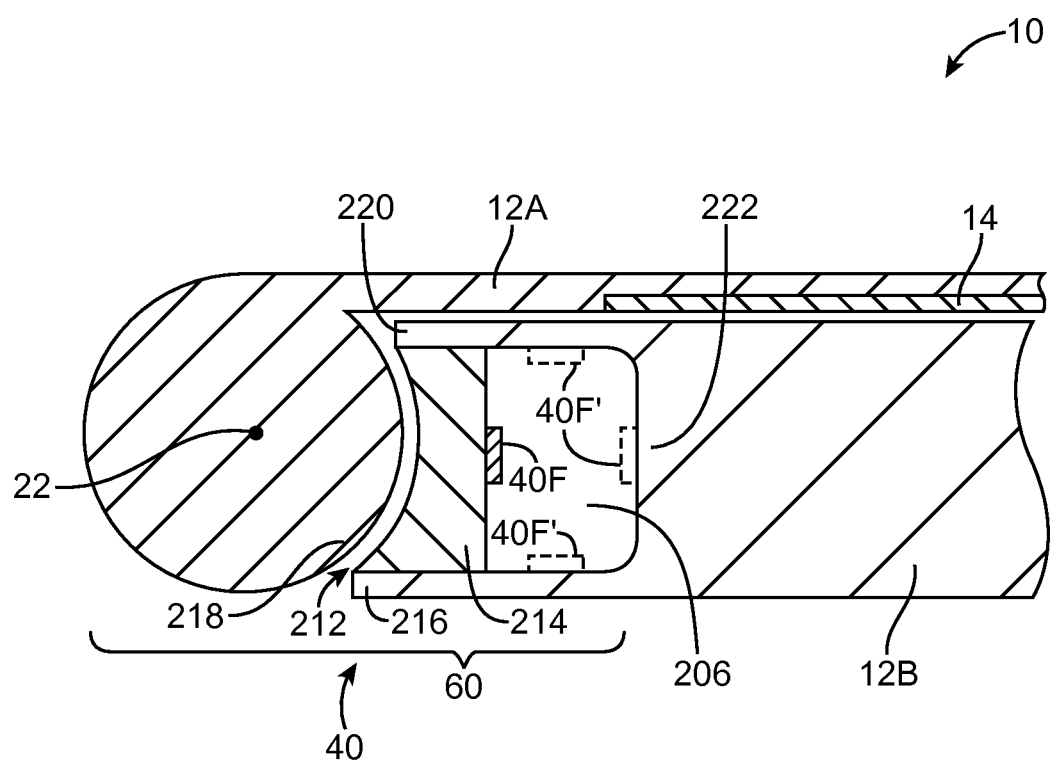
FIG. 8 is a cross-sectional side view of an illustrative electronic device such as a portable computer having a lid in a closed position and having antenna structures in accordance with an embodiment.

A cross-sectional side view of device 10 showing how a cavity antenna for device 10 of FIG. 1 may be implemented in clutch barrel region 60 is shown in FIG. 8. As shown in FIG. 8, cavity antenna 40 may be formed by placing antenna feed element 40F within cavity 206. The walls of cavity 206 may be formed by metal structures in device 10 such as housing 12. For example, portions of lower housing 12B may be used to define metal walls for cavity 206. Housing portion 220 may form upper wall 200-4 of FIG. 7, housing portion 216 may form lower wall 200-2 of FIG. 7, and housing portion 222 may form rear wall 200-5 of cavity structures 200 (as an example). Antenna element 40F may be mounted on a plastic carrier such as carrier 214 or may be mounted on other suitable support structures. If desired, antenna element 40F may be mounted in locations such as locations 40F' of FIG. 8.

Opening 208 of cavity 206 may be formed between portion 220 of housing 12B and portion 216 of housing 12B. Portions of housing 12A may partially block opening 208, but antenna signals may pass through one or more gaps such as slot-shaped opening 212 (i.e., a gap formed between portion 216 of housing 12B and opposing housing portion 218 of housing 12A that runs along the rear edge of housing 12 parallel to axis 22).

Figure 9:
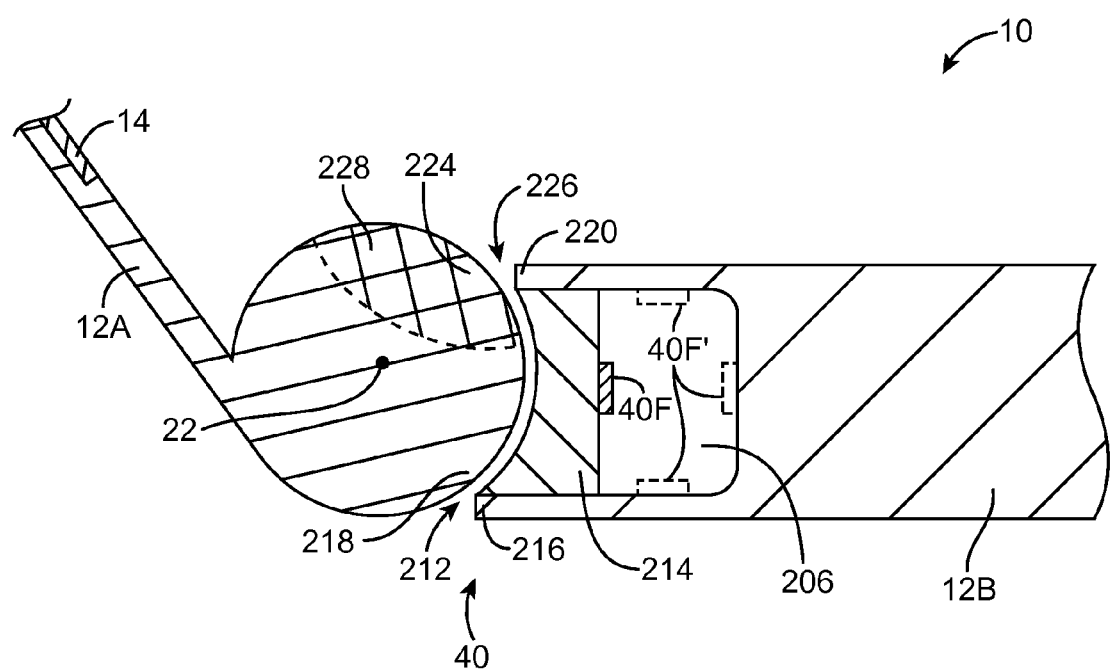
FIG. 9 is a cross-sectional side view of an illustrative electronic device such as a portable computer having a lid in an open position and having antenna structures in accordance with an embodiment.

In the configuration of FIG. 8, lid 12A is in its closed position, resting against lower housing 12B. FIG. 9 is a cross-sectional side view of the structures of FIG. 8 when lid 12A has been placed in its open position by rotating lid 12A around hinge axis 22.

In the open-lid configuration of FIG. 9, cavity antenna 40 can operate through gaps such as upper gap 226 and lower gap 212 (e.g., slot-shaped openings that run parallel to axis 22 and that are formed from opposing metal structures such as portion 220 of housing 12B and portion 224 of housing 12A for gap 226 and from opposing metal structures such as portion 216 of housing 12B and portion 218 of housing 12A for gap 212). Gaps such as gaps 226 and 212 may have widths of about 1.2-1.5 mm, of about 1-3 mm, of less than 4 mm, of more than 2 mm, or other suitable size. If desired, portions of housing 12A such as portion 228 of FIG. 9 may be formed from a dielectric such as plastic to help enhance the effective width of gap 226 and thereby enhance antenna efficiency. Dielectric portion 228 is adjacent to rotational axis 222 and when present increases the width of gap 226 (i.e., the spacing between the opposing metal portions of housing 12A and housing 12B). When gap 226 is enlarged, the wireless antenna signals being handled by the cavity antennas can pass through gap 226 without being blocked by metal housing structures.

Figure 10:
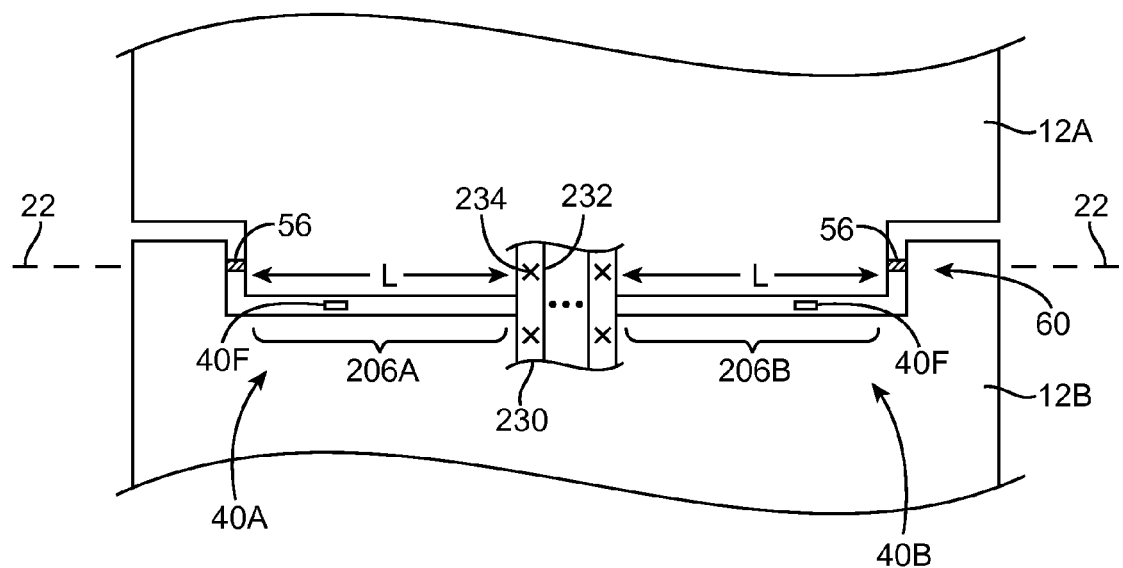
FIG. 10 is a top view of an illustrative electronic device such as a portable computer with its lid in an open position showing how a clutch barrel portion of the electronic device can be divided into two antenna cavities by a flexible printed circuit between the antenna cavities in accordance with an embodiment.

FIG. 10 shows how two cavities may be formed within clutch barrel 60. As shown in FIG. 10, flexible printed circuit 230 may run between lower housing 12B and upper housing 12A across clutch barrel region 60. Lower housing 12B may include control circuitry and other circuitry mounted on one or more printed circuit substrates. This circuitry may be coupled to display 14 using signal paths formed from metal traces 232 on flexible printed circuit 230. Flexible printed circuit 230 may be formed from a flexible polymer substrate such as a layer of polyimide or a sheet of other polymer material. Ground connections 234 in the middle of clutch barrel 60 may be used to short ground traces on flexible printed circuit 230 to housing 12A and to housing 12B.

The presence of flexible printed circuit 230 in the middle of clutch barrel 60 divides clutch barrel 60 into two parts (i.e., the metal cavity structures formed from housing 12 in clutch barrel region 60 are separated into two cavities by flexible printed circuit 230, which is grounded to housing 12B by ground connections 234 that are adjacent to the two cavities). In this way, the presence of flexible printed circuit 230 forms cavity 206A and cavity 206B. Cavity 206A has an inner end that is formed by flexible printed circuit 230 (i.e., flexible printed circuit 230 forms cavity wall 200-3 of FIG. 6 for cavity 206A). Cavity 206A has an opposing outer end (wall 200-1 of cavity structures 200 of FIG. 6) that is formed by the left-hand hinge 56 of FIG. 10 and adjacent portions of housing 12. Cavity 206B has an inner end that is formed by flexible printed circuit 230 (i.e., flexible printed circuit 230 forms cavity wall 200-1 of FIG. 6 for cavity 206B). Cavity 206B has an opposing outer end (wall 200-3 of cavity structures 200 of FIG. 6) that is formed by the right-hand hinge 56 of FIG. 10 and adjacent portions of housing 12. Cavities 206A and 206B are located between respective hinges 56 and are separated by flexible printed circuit 230.

Cavity 206A is used in forming first cavity antenna 40A and cavity 206B is used in forming second cavity antenna 40B. Antennas 40A and 40B may be cavity antennas such as illustrative cavity antenna 40 of FIGS. 8 and 9 (as an example). To enhance antenna efficiency, it may be desirable to configure the size of cavities 206A and 206B to allow antennas 40A and 40B to operate at desired communications frequencies. As an example, it may be desirable for length L (i.e., the length of each cavity and the length of associated slots such as slots 226 and 212, which is effectively half of the perimeter of the cavities and slots in configurations in which the cavities are elongated) to be equal to one wavelength at a communications band frequency of interest. Other cavity shapes may be used if desired. With one suitable arrangement, antennas 40A and 40B may be dual band wireless local area network antennas (e.g., WiFi® antennas) operating at frequencies such as 2.4 GHz and 5 GHz.

Figure 11:
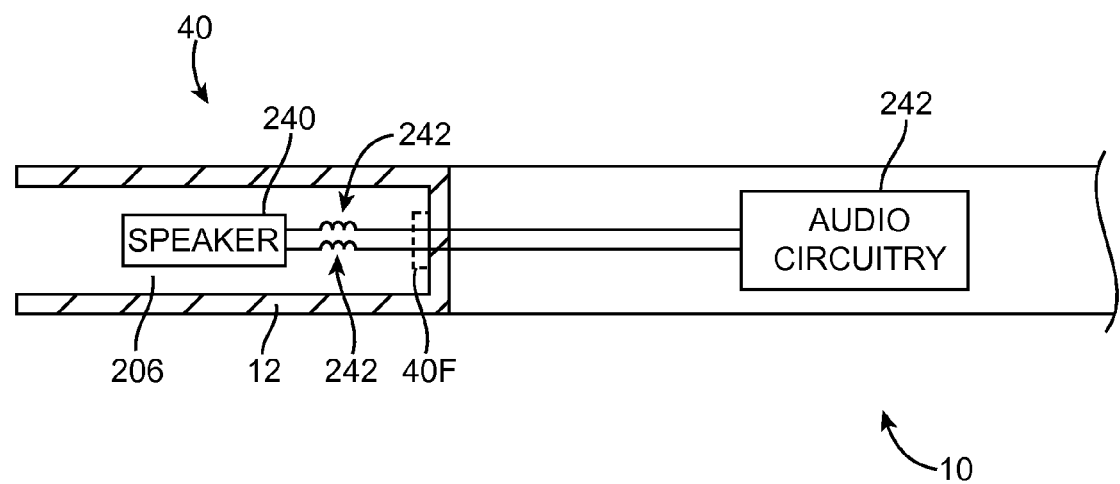
FIG. 11 is a cross-sectional side view of an illustrative electronic device such as a portable computer showing how components such as electrically isolated speakers may float within an antenna cavity in accordance with an embodiment.

As shown in the example of FIG. 11, an audio component such as speaker 240 may be mounted within cavity 206 of cavity antenna 40. Inductors 242 may be interposed in the pair of signal paths coupling speaker 240 to audio circuitry 242. At frequencies associated with the antenna signals handled by antenna 40, inductors 242 will exhibit high impedances. The configuration of FIG. 11 therefore allows speaker 240 to electrically float within cavity 206 and prevents speaker 240 from interfering with the operation of antenna 40. The arrangement for FIG. 11 may be used for antenna 40A and for antenna 40B of FIG. 10 (i.e., one or more speakers 240 may be mounted in each antenna cavity).

The foregoing is merely illustrative and various modifications can be made by those skilled in the art without departing from the scope and spirit of the described embodiments. The foregoing embodiments may be implemented individually or in any combination.

What is claimed is:

1. A portable computer, comprising:
    a housing having an upper housing portion that contains a display and having a lower housing portion that contains a keyboard;
    hinges that connect the upper housing portion to the lower housing portion so that the upper housing portion rotates relative to the lower housing portion about a rotational axis between a closed position and an open position, wherein there is a gap between opposing metal portions of the upper and lower housing portions; and
    an antenna having an antenna resonating element in the lower housing portion between the hinges that transmits and receives antenna signals through the gap, wherein the antenna resonating element is interposed between upper and lower metal surfaces of the lower housing portion.

2. The portable computer defined in claim 1 wherein the gap has a slot shape and runs parallel to the rotational axis and the antenna transmits and receives antenna signals through the gap when the upper housing portion is in the closed position.

3. The portable computer defined in claim 2 wherein the antenna is a cavity antenna.

4. The portable computer defined in claim 3 wherein there is an upper gap between the upper and lower housing portions when the upper housing portion is in the open position and the antenna transmits and receives antenna signals through the upper gap when the upper housing portion is in the open position.

5. The portable computer defined in claim 4 wherein there is a lower gap between the upper and lower housing portions when the upper housing portion is in the open position.

6. The portable computer defined in claim 5 wherein the antenna transmits and receives antenna signals through both the lower gap and the upper gap when the upper housing portion is in the open position.

7. The portable computer defined in claim 6 wherein the antenna is one of a pair of first and second cavity antennas located between the hinges.

8. The portable computer defined in claim 7 further comprising a signal path that passes between the upper housing portion and the lower housing portion and that is interposed between the first and second cavity antennas.

9. The portable computer defined in claim 8 wherein the first and second cavity antennas comprises dual band antennas.

10. The portable computer defined in claim 9 wherein the first and second cavity antennas are configured to operate in a 2.4 GHz communications band and a 5 GHz communications band.

11. The portable computer defined in claim 10 wherein the upper and lower gaps have slot shapes that run parallel to the rotational axis.

12. The portable computer defined in claim 11 wherein the upper housing portion comprises a metal upper housing and wherein the lower housing portion comprises a metal lower housing.

13. A portable computer, comprising:
    an upper metal housing that contains a display;
    a lower metal housing that contains a keyboard;
    hinges that connect the upper metal housing to the lower metal housing so that the upper metal housing rotates relative to the lower metal housing about a rotational axis between a closed position and an open position, wherein when the upper metal housing is in the open position there is an upper gap between the upper metal housing and the lower metal housing that runs parallel to the rotational axis and there is a lower gap between the upper metal housing and the lower metal housing that runs parallel to the rotational axis; and
    an antenna in the lower metal housing between the hinges that transmits and receives antenna signals through the upper gap and through the lower gap when the upper metal housing is in the open position.

14. The portable computer defined in claim 13 wherein the antenna transmits and receives the antenna signals through the lower gap when the upper metal housing is in the closed position.

15. The portable computer defined in claim 14 wherein the antenna is a dual band cavity antenna.

16. The portable computer defined in claim 15 wherein the dual band cavity antenna is configured to operate in communications bands at 2.4 GHz and 5 GHz.

17. A portable computer, comprising:
    an upper metal housing that contains a display;
    a lower metal housing that contains a keyboard;
    hinges that connect the upper metal housing to the lower metal housing so that the upper metal housing rotates relative to the lower metal housing about a rotational axis between a closed position and an open position, wherein when the upper metal housing is in the open position there is an upper gap between the upper metal housing and the lower metal housing that runs parallel to the rotational axis and there is a lower gap between the upper metal housing and the lower metal housing that runs parallel to the rotational axis and wherein when the upper metal housing is in the closed position the lower gap is between the upper metal housing and the lower metal housing; and
    first and second cavity antennas in the lower metal housing between the hinges that transmit and receive antenna signals through the upper gap and through the lower gap when the upper metal housing is in the open position and that transmit and receive antenna signals through the lower gap when the upper metal housing is in the closed position.

18. The portable computer defined in claim 17 wherein the first and second cavity antennas are dual-band antennas.

19. The portable computer defined in claim 18 wherein the first and second cavity antennas are each configured to operate in communications bands at 2.4 GHz and 5 GHz.

20. The portable computer defined in claim 19 wherein the first cavity antenna comprises a first inverted-F resonating element and wherein the second cavity antenna comprises a second inverted-F resonating element.

* * * * *